US012736773B2

(12) United States Patent
Schweigert et al.

(10) Patent No.: US 12,736,773 B2
(45) Date of Patent: Sep. 15, 2026

(54) OPTICAL ELEMENT, OPTICAL ARRANGEMENT AND INSERT COMPONENT

(71) Applicant: Carl Zeiss SMT GmbH, Oberkochen (DE)

(72) Inventors: Eduard Schweigert, Syrgenstein (DE); Stefan Hembacher, Bobingen (DE); Soeren Knorr, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 371 days.

(21) Appl. No.: 18/469,169

(22) Filed: Sep. 18, 2023

(65) Prior Publication Data

US 2024/0004160 A1 Jan. 4, 2024

Related U.S. Application Data

(63) Continuation of application No. PCT/EP2022/055551, filed on Mar. 4, 2022.

(30) Foreign Application Priority Data

Mar. 31, 2021 (DE) ......................... 102021203288.5

(51) Int. Cl.
*G02B 7/195* (2021.01)
*G02B 7/18* (2021.01)
(Continued)

(52) U.S. Cl.
CPC ......... *G02B 7/1815* (2013.01); *G03F 7/7015* (2013.01); *G03F 7/70891* (2013.01); *G02B 5/0891* (2013.01)

(58) Field of Classification Search
CPC ... G02B 7/1815; G02B 5/0891; G03F 7/7015; G03F 7/70891
See application file for complete search history.

(56) References Cited

U.S. PATENT DOCUMENTS 7,591,561 B2 * 9/2009 Phillips .................... G21K 1/06 359/845
2018/0239252 A1 * 8/2018 Nienhuys ............ G03F 7/70891
(Continued)

FOREIGN PATENT DOCUMENTS

DE 102019217530 A1 12/2019
DE 102020119329 A1 3/2021
(Continued)

OTHER PUBLICATIONS

International Search Report and Written Opinion for corresponding PCT Appl No. PCT/EP2022/055551, dated Jun. 29, 2022.
(Continued)

*Primary Examiner* — Euncha P Cherry
(74) *Attorney, Agent, or Firm* — Fish & Richardson P.C.

(57) ABSTRACT

An optical element for reflecting radiation, such as EUV radiation, comprises: a substrate; a reflective coating applied to a surface of the substrate; a plurality of cooling channels, which run in the substrate below the surface on which the reflective coating is applied; a distributor for connecting at least one cooling fluid inlet to the plurality of cooling channels; and a collector for connecting the plurality of cooling channels to at least one cooling fluid outlet. The distributor and/or the collector are integrated into at least one, optionally rod-like insert component which is introduced into at least one cavity formed in the substrate. An optical arrangement, such as an EUV lithography system, comprises: at least one optical element formed in the manner described further above; and a cooling device which is designed for the flowing of a cooling fluid through the plurality of cooling channels.

22 Claims, 6 Drawing Sheets

(51) Int. Cl.

| | |
|---|---|
| ***G03F 7/00*** | (2006.01) |
| *G02B 5/08* | (2006.01) |

(56) References Cited

U.S. PATENT DOCUMENTS

| | | | | |
|---|---|---|---|---|
| 2019/0322155 | A1* | 10/2019 | Kim ................... | B60H 1/00278 |
| 2021/0063725 | A1 | 3/2021 | Branigan et al. | |

FOREIGN PATENT DOCUMENTS

| | | | |
|---|---|---|---|
| DE | 102020203765 | A1 | 9/2021 |
| DE | 102020208648 | A1 | 1/2022 |
| DE | 102021201715 | A1 | 8/2022 |
| EP | 0520671 | A1 | 12/1992 |
| WO | WO2012046133 | A2 | 4/2012 |
| WO | WO2020207741 | A1 | 10/2020 |
| WO | WO2021190835 | A1 | 9/2021 |
| WO | WO2022008155 | A1 | 1/2022 |
| WO | WO2022179735 | A1 | 9/2022 |

OTHER PUBLICATIONS

Anthony F.M., "High Heat Load Optics: an historical overview", Optical Engineering, Soc. of Photo-Optical Instrumentation Engineers, Bellingham, vol. 34, No. 2, Feb. 1, 1995 (Feb. 1, 1995), pp. 313-320, XP000490719.

Anthony, "High heat load optics: an historical overview," Optical Engineering, Feb. 1995, 34(2):313-320.

Office Action in German Appln. No. 10 2021 203 288.5, mailed on Oct. 5, 2021, 5 pages (with English translation).

Office Action in Taiwanese Appln. No. 111112267, mailed on Dec. 16, 2025, 12 pages (with English translation).

Office Action in Chinese Appln. No. 202280026512.8, mailed on Apr. 25, 2026, 21 pages (with English translation).

* cited by examiner 29
42b
42a
43a
43b
T3
T2
T1
Y
X
31

29
T3
T2
T1
Y
X
31

60
53
56a
29a
37
39
29b
31
56b 60
53
34
62d
62a
32
61a
29a
62c
56a
29b
62b
39
37
56b
61b
Tist
Tsoll
31
63

OPTICAL ELEMENT, OPTICAL ARRANGEMENT AND INSERT COMPONENT

CROSS-REFERENCE TO RELATED APPLICATION

The present application is a continuation of, and claims benefit under 35 USC 120 to, international application PCT/EP2022/055551, filed Mar. 4, 2022, which claims benefit under 35 USC 119 of German Application No 10 2021 203 288.5, filed Mar. 31, 2021. The entire disclosure of each these applications is incorporated by reference herein.

FIELD

The disclosure relates to an optical element for reflecting radiation, such as for reflecting EUV radiation, comprising: a substrate, a reflective coating that is applied to a surface of the substrate, a plurality of cooling channels, which run in the substrate below the surface on which the reflective coating is applied, a distributor for connecting at least one cooling fluid inlet to the plurality of cooling channels, and a collector for connecting the plurality of cooling channels to at least one cooling fluid outlet. The disclosure also relates to an optical arrangement, such as an EUV lithography system, which comprises at least one such optical element and a cooling device which is designed for the flowing of a cooling fluid through the plurality of cooling channels. The disclosure also relates to an insert component, such as for an optical element formed in the manner described further above.

BACKGROUND

In general, there is an ever-increasing thermal load on reflecting optical elements for lithography, such as for EUV lithography, on account of the ever-increasing power of the radiation sources used in the operation thereof. This applies for example to the mirrors of projection systems in EUV lithography apparatuses. In general, attempts are made to use as the substrates of such reflecting optical elements, which are also referred to as mirrors below to simplify matters, materials with a coefficient of thermal expansion that is as close to "zero" as possible. In reality, the best-case scenario is that of satisfying this property for a certain temperature, which is also referred to as zero crossing temperature.

A respective mirror in such a projection system typically heats up differently depending on the various settings or illumination states, and so the mirror can only ever be operated in the vicinity of the zero crossing temperature. This can lead to the mirror, more precisely the surface with the reflective coating, deforming under the thermal load during the radiation. With increasing thermal load, this "mirror heating" issue can have a limiting effect on the performance of the optical arrangement in which the mirror is arranged.

There are mechatronic approaches for solving this issue. Another, comparatively simple concept involves directly cooling a respective mirror, that is to say having a cooling fluid flow through the substrate of the mirror, more precisely in cooling channels formed on the substrate. This concept involves the temperature of the mirror being able to be set comparatively precisely by way of the temperature of the cooling fluid, that is to say the mirror has a thermal reference.

A distributor for connecting (at least) one cooling fluid inlet of the substrate to the plurality of cooling channels and a collector for connecting the plurality of cooling channels of the substrate to (at least) one cooling fluid outlet are used in order to have to realize as few direct connections on the substrate of the mirror as possible.

DE 10 2019 217 530 A1 has disclosed an optical element in the form of a mirror which has a first layer made of the first material and a second layer made of a second material, which are put together along an interface. The optical element has a cooling device which runs in the region of the interface and which is configured to cool the optical element. The cooling device may have a plurality of cooling channels, through which a cooling fluid, for example cooling water, is able to flow. The cooling channels may extend parallel to one another and laterally open into side channels which are connected to a cooling fluid inlet or to a cooling fluid outlet. In this case, a respective side channel fulfils the function of a distributor that is formed in the substrate or a collector that is formed in the substrate.

Internal pressure arises in the cooling channels and, for example, in the distributor or in the collector when a cooling fluid, such as a cooling liquid, flows through the cooling channels, the internal pressure possibly leading to unwanted deformations on the surface to which the reflective coating is applied.

SUMMARY

The disclosure seeks to provide an optical element, an optical arrangement and an insert component which allow deformations on the surface of the optical element to which the reflective coating is applied to be reduced on account of a direct cooling with a cooling fluid. A temperature distribution in the substrate can be influenced in a targeted fashion during the cooling with the cooling fluid.

According to a first aspect, the disclosure provides an optical element in which the distributor and/or the collector are integrated into at least one, optionally rod-like insert component which is introduced into at least one cavity formed in the substrate.

In the optical element, the distributor or the collector is not formed directly in the substrate of the reflecting optical element; instead, the distributor and/or the collector is integrated into an insert component which is introduced or inserted into the substrate, more precisely into a cavity formed in the substrate. The insert component may be formed in one piece, but the insert component may also have a main body in which further components are integrated (see below). Typically, the insert component or the main body is formed from a material which does not expand, or only expands minimally, when cooling fluid flows therethrough. Moreover, the material of the insert component or the main body should deform as little as possible in the case of temperature variations.

The cooling channels provided for cooling fluid to flow through have at least one opening or a passage to the at least one cavity in which the at least one insert component is received. It was found to be advantageous if the insert component has a rod-like, elongate form or a substantially cylindrical geometry in order to facilitate the distribution of the cooling fluid among the cooling channels in the style of a distributor comb (or an undulating distributor) and/or the collection of the cooling fluid from the cooling channels in the style of a collector comb. It is understood that the rod-shaped, substantially cylindrical geometry of the insert component need not necessarily be of circular cylindrical geometry.

Two (or optionally more) insert components, which satisfy either the function of the distributor or the function of the collector, may be introduced into the substrate. The two or more insert components may be introduced into a common cavity or into two or more separate cavities. The cavity or cavities may be through-bores or through-channels. However, the use of the cavities in the form of blind holes or blind bores was found to be advantageous for the present purposes.

In an embodiment, both the distributor and the collector are integrated into a common insert component, the at least one cooling fluid inlet and the at least one cooling fluid outlet optionally being formed on the same side of the insert component for the purposes of connecting to at least one pipeline, optionally to a double pipeline. In this case, the cooling fluid can be supplied and led away in one and the same insert component. Ideally, the cooling fluid inlet and the cooling fluid outlet are formed on the same side, for example an end side, of the insert component in order to reduce the number of connectors for supplying the cooling fluid and leading the cooling fluid away. This can be desirable for reducing the dynamic and thermoplastic interaction between the usually metallic material of the connector and the material of the substrate (e.g., in the form of a zero crossing material). Should the insert component have a substantially rod-shaped form, the cooling fluid inlet and the cooling fluid outlet are typically located on the same end side of the rod-shaped insert component. The other end side is located in the substrate, for example at or in the vicinity of a base of the cavity if the latter is formed in the style of a blind hole.

The design freedom for the optical element can be increased by integrating supply and leading away mechanisms in a common insert component. The dynamic performance of the cooling in view of flow-induced vibrations may possibly also be increased if the cooling fluid flows in opposite directions in the distributor and in the collector within the insert component, such that the forces exerted by the flowing cooling fluid optionally compensate one another.

In a development of this embodiment, the at least one coolant inlet is mounted radially on the inside to the rod-like insert component for the purposes of connecting to an interior of an inner pipe of the double pipeline and the at least one coolant outlet is mounted radially on the outside to the rod-like insert component for the purposes of connecting to an interstice between the inner pipe and an outer pipe of the double pipeline, or vice versa. In this way and with the aid of the double pipeline, the cooling fluid can be supplied to and led away from the insert component via one and the same connector of the double pipeline. By way of example, the cooling fluid can be supplied to the optical element in the interior of the inner pipe and can be led away from the optical element in the interstice between the inner pipe and the outer pipe. However, it is likewise possible for the cooling fluid to be supplied to the optical element through the interstice of the double pipeline and to be led away from the optical element through the interior of the inner pipe of the double pipeline.

In an embodiment, the optical element comprises at least one seal for sealing a gap, which is formed between a wall of the cavity and the insert component introduced into the cavity, with respect to the surroundings. The insert component is typically introduced into the cavity with a little play. This leads to a gap forming between the wall of the cavity and the insert component, through which gap the cooling fluid can escape from the cavity into the surroundings of the substrate or optical element if no seal is provided. At least one seal is arranged between the wall of the cavity and the insert component in order to prevent this. In the case of a rod-shaped insert component, the seal typically extends on the lateral face of the insert component in the circumferential direction. In this case, the seal can be for example an O-ring or the like. The seal is arranged between the feeders and offtakes formed in the insert component (see below) for supplying the cooling fluid to the cooling channels from the surroundings of the optical element and for leading the cooling fluid away from the cooling channels to the surroundings of the optical element, respectively.

The seal at the passage of the cooling fluid from the insert component to a respective cooling channel in the substrate of the optical element is implemented contactlessly in this case by way of the narrow gap between the wall of the cavity and the insert component. The dimensions of the insert component and the wall of the cavity are ideally chosen in such a way that the gap or the width of the gap is minimal at the operating temperature of the optical element and is for example less than 0.5 mm or less than 0.1 mm. A passage of cooling fluid between adjacent cooling channels can be minimized with the aid of a gap with the smallest possible width. Additionally, a flow separation of the cooling fluid may be reduced or optionally avoided entirely in the case of a gap with a small width, which reduces or ideally completely prevents flow-induced vibrations (Hy).

It can be desirable if the insert component deforms as little as possible, that is to say expands and contracts as little as possible, in the case of temperature variations. To this end, the insert component or the main body of the insert component may be formed from a material which has a very low coefficient of thermal expansion. By way of example, this is the case should the insert component or its main body be formed from Invar. Should the insert component or its main body be produced by an additive manufacturing method, a glass or glass ceramic with a low coefficient of thermal expansion may optionally be used as a material. By way of example, the material can be titanium-doped fused quartz, as offered by Corning under the ULE® brand.

On account of the gap, cooling fluid passes between a region of the insert component where the cooling fluid is supplied to a cooling channel via the distributor, or via a respective inlet of the distributor, and a region of the insert component where the cooling fluid is led away from a respective cooling channel via a respective offtake of the collector. Therefore, there is a slight pressure loss in the supplied cooling medium on account of the gap. However, such a pressure loss is unproblematic in general since the flow rate tends to be decisive for the cooling performance. Moreover, a seal by way of a gap (a so-called gap seal) which allows pressures of several 100 bar to be transmitted despite the pressure loss at the gap seal is known from hydraulic cylinders on machine tools.

Should the distributor and the collector be arranged on different sides on the external circumference of the reflective coating, the cooling channels in the substrate frequently run substantially in a straight line below the surface on which the reflective coating is applied, or the cooling channels have a curvature that is matched to a curvature of the surface on which the reflective coating is applied.

In an embodiment, at least one cooling channel has at least one deflection portion for deflecting the cooling fluid, for example for reversing a direction of flow of the cooling fluid. By housing the distributor and/or the collector in an (optionally common) insert component, the design freedom for the design of the cooling channels is increased, that is to say these may have different geometries, for example run in a spiral shape, meandering shape, etc. To drain the cooling fluid, which was supplied to the cooling channels via the distributor of the insert component, via the collector of one and the same insert component again, it is typically desirable for the cooling channel to have (at least) one deflection portion which deflects the cooling fluid. It may be desirable if the deflection portion reverses the direction of flow of the cooling fluid such that the cooling fluid post deflection flows in parallel and in the opposite direction, but this is not mandatory.

The geometry or the zone below the surface covered by a respective cooling channel may be defined depending on which regions or zones of the optical element should have a uniform cooling effect: As described in more detail below, the cooling effect of the cooling medium can be set in a targeted fashion in a respective cooling channel. However, in general, influencing the temperature of the cooling fluid in a targeted, spatially varying fashion is not possible in one and the same cooling channel. As a result of the measures described further below, targeted control of the cooling in a respective zone can be achieved in order to set a desired, for example homogeneous temperature distribution on the surface to which the reflective coating is applied.

It is possible for one and the same cooling channel to have two or more channel portions which, proceeding from the distributor, extend back to the collector via a respective deflection portion. In this case, the flow of the cooling fluid is divided among the two or more channel portions proceeding from the distributor or a feeder of the distributor and is brought together again at an offtake of the collector. However, it is also possible for one and the same cooling channel to start from the distributor and be returned to the collector via a deflection portion. It is also possible for the cooling fluid to be supplied to two or more cooling channels level in the longitudinal direction of the insert component if a plurality of feeders or offtakes are provided there. By way of example, two cooling channels may in this case be adjacent to one another on a web or the like formed in the substrate and may extend level in the longitudinal direction of the insert component on opposite sides of the insert component. In this case, the cooling channels are returned to the offtakes by way of a respective deflection portion. In this way, it is possible for cooling channels situated on one side of the insert component, for example the right side, and cooling channels situated on the other side of the insert component, for example the left side, to develop a different cooling effect.

In an embodiment, the distributor has a plurality of feeders for connecting the at least one cooling fluid inlet to at least one cooling channel in each case and/or the collector has a plurality of offtakes for connecting the cooling fluid outlet to at least one cooling channel in each case. The feeders and offtakes open at the outer side of the insert component, typically along its, e.g., cylindrical lateral surface. A respective feeder or offtake is connected to the other feeders or offtakes only by way of the gap. It is possible for a respective feeder or a respective offtake to open directly into a respective cooling channel which extends below the surface to which the reflective coating is applied. In this case, the cooling channel has an opening to the cavity or the wall of the cavity cuts into the cooling channel. Alternatively, the feeder or the offtake may not open directly into a respective cooling channel. In this case, one or more connecting channels are formed in the substrate between the respective cooling channel and the cavity in which the insert component is located, for connecting a respective feeder or offtake of the insert component to the cooling channel.

In an embodiment, the feeders open into at least one common inlet channel that is connected to the at least one cooling fluid inlet and/or the offtakes open into at least one common outlet channel that is connected to the at least one cooling fluid outlet, the at least one common inlet channel optionally running radially to the inside in the insert component and the at least one common outlet channel optionally running radially to the outside in the insert component, or vice versa. The (at least one) common inlet channel and the (at least one) common outlet channel may for example extend substantially in the axial direction in the case of a rod-like insert component. The (at least one) inlet channel radially to the inside and the (at least one) outlet channel radially to the outside facilitate supplying the cooling fluid to the insert component and leading the cooling fluid away from the insert component by way of a single coolant connector, for example by way of a common double pipeline or the like.

In a development of this embodiment, the feeders are connected to the common inlet channel via feed channels that can run (substantially) in the radial direction and/or the offtakes are connected to the common outlet channel via offtake channels that can run (substantially) in the radial direction. Proceeding from the inlet channel or outlet channel, the feed channels or offtake channels extend outwardly to the lateral surface of the insert component or into the region of the gap between the insert component and the substrate. A respective feed channel or offtake channel may extend for example up to the lateral surface or up to the gap in order to supply the cooling fluid to a respective cooling channel or in order to lead the cooling fluid away from a respective cooling channel.

In a development, the feeders form an at least partly circumferential feed groove formed on a lateral surface of the insert component, or the feeders have such a feed groove, and/or the offtakes form an at least partly circumferential offtake groove formed on a lateral surface of the insert component, or the offtakes have such an offtake groove.

Supplying the cooling fluid to the cooling channels and leading the cooling fluid away from the cooling channels can be implemented in a particularly simple manner with the aid of feed grooves and offtake grooves, respectively, which are introduced into the insert component, typically by way of milling. It is possible to mill the feed groove or the offtake groove so deep into the insert component or into the main body thereof that the feed groove or offtake groove directly meets or cuts into the inlet channel or the outlet channel. In this case, the respective feeder is formed by the feed groove and the respective offtake is formed by the offtake groove. However, it is also possible for the feed groove and/or the offtake groove not to extend up to the inlet channel and outlet channel, respectively. In this case, the feeder and the offtake have at least one respective feed channel and offtake channel, respectively, which open into the respective feed groove or offtake groove.

In the case described further above of the inlet channel being formed radially to the inside, a respective feeder may have for example a feed channel which opens into a feed groove on the lateral surface of the insert component. By contrast, a respective offtake may be in the form of an offtake groove if the (at least one) outlet channel is arranged radially further to the outside. It is understood that the provision of feed grooves and/or offtake grooves may optionally be completely dispensed with. This is possible, for example, if the insert component is produced not conventionally but by an additive manufacturing method since in this case even comparatively complex structures may be introduced into the insert component, more precisely into the main body of the insert component. For example, components which fulfil a multiplicity of different functions may be integrated into the insert component in this way, as will be described in more detail below.

In an embodiment, the distributor has at least one switchable valve for supplying the cooling fluid to at least one of the cooling channels, the valve optionally being arranged between the common inlet channel and a feeder. In the simplest case, the switchable valve may have only two switching states which either enable or block the supply of cooling fluid to the feeder. However, it is also possible for the valve to be switchable between a plurality of switching states in order to be able to set the flow rate of the cooling fluid through the valve. Switching between the switching states of the valve is implemented automatically with the aid of a suitable control device. It is often desirable to this end for the switchable valve to be connected to the control device with the aid of a suitable electrical connection (e.g., via wires). Should the flow rate of the cooling fluid through the valve be able to be set incrementally or optionally continuously, it is also possible to incrementally or continuously set the cooling effect of the fluid supplied through the feed. In this way it is possible to influence the temperature of the substrate in the region of the respective cooling channel which runs below the surface with the reflective coating. By way of example, the valve may be a miniature valve which is based on the principle of a shape memory alloy. Provided these are dimensioned sufficiently small, it is also possible to use valves based on other operational principles to this end.

In a development, the distributor has at least two switchable valves, which are connected in parallel for supplying the cooling fluid from the inlet channel to the feeder. A parallel connection of two or more valves can be desirable if a single valve only has a small number of switching states, for example only two switching states. In this case, it may be desirable to use two or more valves connected in parallel for the purposes of setting the flow rate, and hence the cooling effect. By way of example, this allows three different flow rates to be set with the aid of two valves that each have two switching states: no through flow (both valves: off), maximum through flow (both valves on) and half of the maximum through flow (one valve on, one valve off). By setting the cooling effect by way of the flow rate of the cooling fluid, it is possible to reduce the flow rate and hence it is possible to reduce flow-induced vibrations.

In an embodiment, the insert component has at least one temperature control element for controlling the temperature of the cooling fluid, for example at least one heating element for heating the cooling fluid, before the cooling fluid is supplied to the at least one cooling channel, the temperature control element optionally being arranged between the inlet channel and a feeder. The (at least one) temperature control element serves to control the temperature of the cooling fluid, that is to say to heat and/or cool the cooling fluid, which is supplied to (at least) one cooling channel. The (at least one) temperature control element may be (at least one) heating element for example, which serves to heat the cooling fluid supplied to (at least) one cooling channel. By way of the heating element it is possible to reduce the cooling effect of the cooling fluid in the respective cooling channel. Therefore, an effect similar to that of the switchable valve can be obtained with the aid of the heating element.

To set the temperature gradient in the individual cooling channels or between the cooling channels it is possible in this case to operate the inlet channel with a significantly colder cooling fluid than is conventional, for example at a temperature of 18° C., and the cooling fluid supplied to the cooling channels that should be cooled less or not at all can be heated prior to the entry into the respective cooling channel (e.g., to room temperature, that is to say to 22° C.). By way of example, the heating elements may be miniaturized heaters operating on the basis of silicon nitride, but may also be different types of heating elements that can be dimensioned to be sufficiently small.

It is possible for the insert component to have only switchable valves or only temperature control or heating elements, but it is also possible to combine both types of structural elements in the insert component. By way of example, both a switchable valve and a temperature control or heating element may be arranged between the inlet channel and one and the same feeder. It is also possible to integrate a switchable valve and a temperature control or heating element into one and the same component.

In an embodiment the insert component has at least one temperature sensor for monitoring the temperature of the cooling fluid in at least one cooling channel, in at least one inlet channel and/or in at least one outlet channel. Knowledge about the temperature in the respective cooling channels or in the inlet channel and/or the outlet channel may allow conclusions to be drawn about the temperature distribution of the optical element in the region of the surface to which the reflective coating is applied. Depending on the temperature distribution, parameters of the optical arrangement in which the optical element is integrated may be adapted.

In the case where the temperature in a respective cooling channel should be measured with the aid of the temperature sensor, the temperature sensor may be arranged between the offtake and the outlet channel, for example. In the case where a temperature control or heating element is present, the temperature sensor may also be arranged between the inlet channel and the feeder, to be precise typically downstream of the temperature control or heating element in the direction of flow of the cooling fluid, or in the temperature control or heating element itself. In general, arranging the temperature sensor between the inlet channel and the temperature control or heating element is not desirable since the temperature of the cooling fluid at that location does not differ, or does not differ significantly, from the temperature in the inlet channel, which may optionally be measured with the aid of an independent temperature sensor. The temperature of the cooling fluid in the inlet channel can be measured using a temperature sensor arranged in the direct vicinity of the cooling fluid inlet. Accordingly, the temperature of the cooling fluid in the outlet channel may also be determined with the aid of a suitably arranged temperature sensor. The temperature sensor arranged in the outlet channel can be arranged in the direct vicinity of the (at least one) cooling fluid outlet.

In a development of this embodiment, the insert component has a closed-loop control device (a controller) for regulating the temperature of the cooling fluid to a target temperature by acting on the at least one switchable valve and/or on the at least one temperature control element. The temperature sensor or sensors can be used to carry out closed-loop control of the temperature in the respective cooling channels and hence on the surface of the optical element to which the reflective coating is applied. In this case, the temperature sensors are combined with the valves and/or with the temperature control or heating elements in order to form the control loop, that is to say the closed-loop control device acts on the valves or on the temperature control or heating elements as actuators. However, it is also possible for the temperature sensor or sensors to be integrated into the insert component without valves, temperature control or heating elements or other actuators for a control loop being arranged in the insert component.

In an embodiment, the insert component has at least one cable channel for guiding electrical lines for electrically contacting the at least one valve, the at least one temperature control element and/or the at least one temperature sensor. The corresponding electrical lines are guided or received in the cable channel. Like the inlet channel and the outlet channel, the cable channel may extend in the longitudinal direction of the (rod-like) insert component. To prevent the electrical lines that contact the valves, the temperature control elements and/or the temperature sensors from coming into contact with the cooling fluid, it may be desirable to mould the corresponding components into the main body of the insert component.

In an embodiment, the substrate has a first partial body and a second partial body which are put together at an interface, the reflective coating being applied to a surface of the first partial body and the plurality of cooling channels running in the substrate in the region of the interface between the two partial bodies.

To have sufficient play for the geometric design, it may be desirable for the channel geometries of the cooling channels to be formed in two or more partial bodies of the substrate that are connected to one another by way of a suitable bonding method or optionally by optical contact bonding at one or more interfaces. The cross section of a respective cooling channel may be split among the two partial bodies. In this case, a respective flute-shaped depression or groove may be formed in the first partial body and a further flute-shaped depression or groove may be formed in the second partial body, the two flute-shaped depressions or grooves being put together to form a single cooling channel when the two partial bodies are connected along the interface, for example as described in DE 10 2019 217 530 A1. In this case, a respective groove is milled both into the first partial body and into the second partial body. However, it is also possible that a groove is only milled into the first partial body or only into the second partial body and the respective other partial body covers the groove in the style of a lid in order to form the cross section of the cooling channel. In both cases, the interface runs within or on the edge of the cross section of a respective cooling channel. The cover which covers the cooling channel typically is the first partial body, on which the surface with the reflective coating is formed.

A further aspect of the disclosure relates to an optical arrangement, such as an EUV lithography system, comprising: at least one optical element configured in the manner described further above, and a cooling device which is designed for the flowing of a coolant through the plurality of cooling channels. The EUV lithography system can be an EUV lithography apparatus for exposing a wafer, or can be some other optical arrangement that uses EUV radiation, for example an EUV inspection system, for example for inspecting masks, wafers or the like that are used in EUV lithography. The reflective optical element may for example be a mirror of a projection system of an EUV lithography unit. The optical arrangement may also be a lithography system for another wavelength range, for example for the DUV wavelength range, for example a DUV lithography apparatus or an inspection system for inspecting masks, wafers or the like.

By way of example, the cooling device may be formed to allow a coolant in the form of a cooling fluid, for example a cooling liquid, for example in the form of cooling water, to flow through the cooling channels. For this purpose, the cooling device may optionally have a pump and also suitable supply and lead-away lines. For example, supply of the cooling fluid to the at least one insert component and leading the cooling fluid away from the at least one insert component may be implemented with the aid of a double pipeline. Optionally, the cooling device may also have the closed-loop control device, which was described further above in the context of the insert component, to which sensor signals from the temperature sensors are transmitted and which is designed to act on the switchable valves and/or the temperature control elements in a manner as described further above.

A further aspect of the disclosure relates to an insert component for introduction into a cavity of a substrate, such as a substrate of an optical element configured as described further above, comprising: a main body with at least one cooling fluid inlet and with at least one cooling fluid outlet, a distributor integrated into the main body for connecting the at least one cooling fluid inlet to a plurality of feeders, and a collector integrated into the main body for connecting the at least one cooling fluid outlet to a plurality of offtakes, the at least one cooling fluid inlet and the at least one cooling fluid outlet optionally being formed on the same side of the optionally rod-like insert component for connecting to at least one pipeline, optionally to a double pipeline.

The insert component described here can have the features described further above in the context of the optical element. The insert component may be produced in conventional fashion by virtue of the main body of the insert component being suitably mechanically processed. In this case, the insert component may be formed in one piece or consist of the main body.

In an embodiment, the main body is produced by an additive manufacturing method. In this case, the main body or the insert component has, in general, a rod-like form. Should the insert component have a rod-like form, the main body may be produced in an additive manufacturing method (3-D printing), for example from a powder bed, generally without support structures. During additive manufacturing, the longitudinal direction of the main body of the insert component corresponds to the construction direction. In general, the individual layers produced during the additive manufacturing have a substantially circular cross section. To achieve the desired surface quality on the lateral surface of the rod-shaped insert component, it is typically desirable to print the external geometry of the main body with an extent of approximately 1 mm. It is therefore recommended not to print the distributor grooves in the process but to introduce these retrospectively in a conventional manner, that is to say usually by way of mechanical processing, for example by milling.

The additive manufacturing of the main body allows structures, which promote the flow of the cooling fluid and, for example, reduce flow-induced vibrations, to be produced in the distributor and in the collector. In general, it is not possible to realize such structures using conventional manufacturing methods. Additionally, the functional components described further above, for example in the form of the valves, temperature control or heating elements and temperature sensors, may be integrated into the main body by additive manufacturing in order thus to realize maximal functional integration in minimal volume.

Further features and aspects of the disclosure are evident from the following description of exemplary embodiments of the disclosure, with reference to the figures of the drawing showing aspects to the disclosure, and from the claims. The individual features can each be realized individually by themselves or as a plurality in any desired combination in one variant of the disclosure.

BRIEF DESCRIPTION OF THE DRAWINGS

Exemplary embodiments are depicted in the schematic drawing and are explained in the following description. In detail.

DETAILED DESCRIPTION

Figure 1:
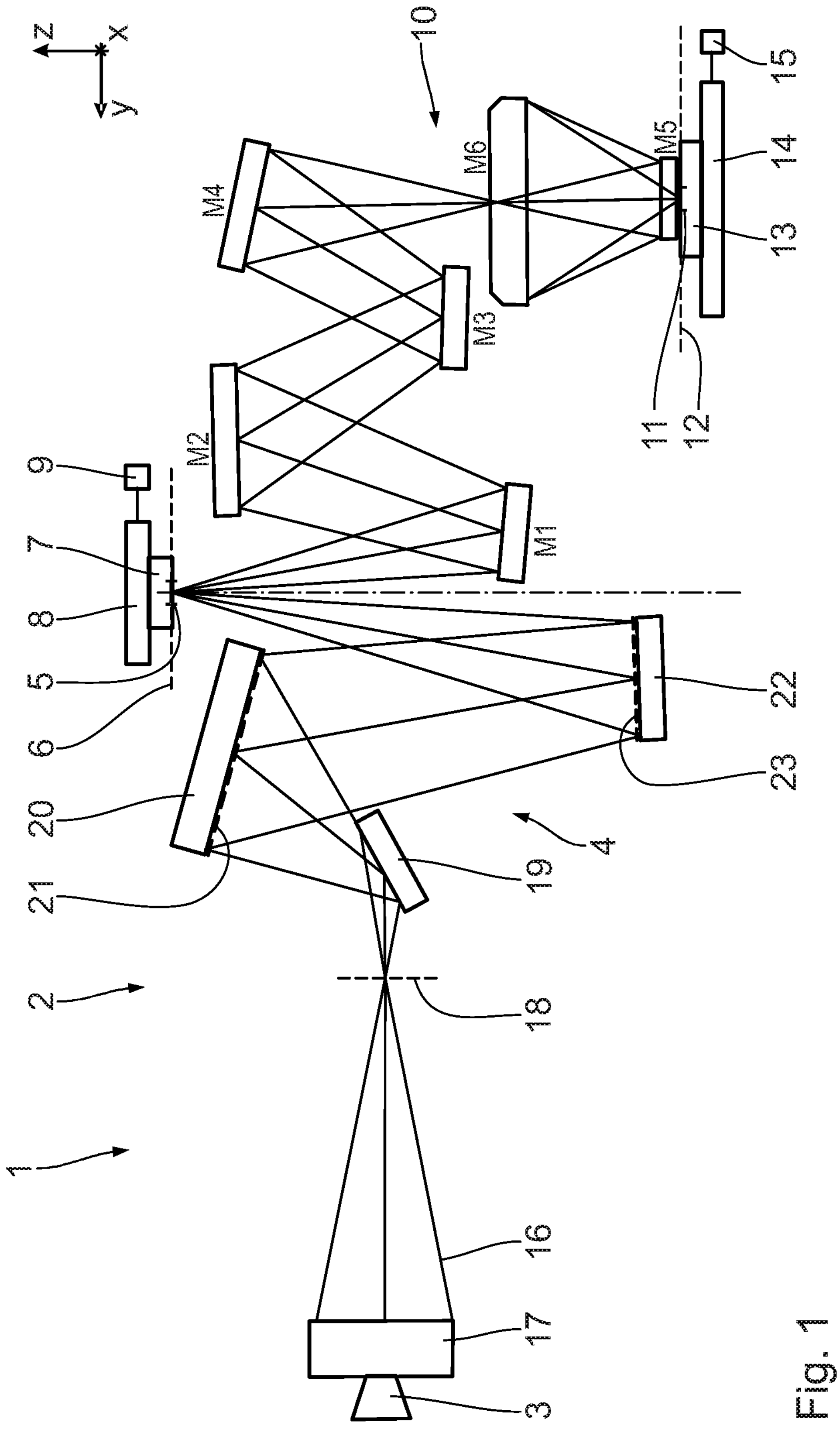
FIG. 1 schematically shows a meridional section of a projection exposure apparatus for EUV projection lithography.

In the following description of the drawings, identical reference signs are used for identical or functionally identical components.

Certain components of an optical arrangement for EUV lithography in the form of a microlithographic projection exposure apparatus 1 (EUV lithography apparatus) are described by way of example below with reference to FIG. 1. The description of the basic set-up of the projection exposure apparatus 1 and the components thereof should not be understood as restrictive in this case.

An embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

A reticle 7 arranged in the object field 5 is illuminated. The reticle 7 is held by a reticle holder 8. The reticle holder 8 is displaceable by way of a reticle displacement drive 9, such as in a scanning direction.

An embodiment of an illumination system 2 of the projection exposure apparatus 1 has, in addition to a light or radiation source 3, an illumination optical unit 4 for illuminating an object field 5 in an object plane 6. In an alternative embodiment, the light source 3 can also be provided as a module separate from the rest of the illumination system. In this case, the illumination system does not comprise the light source 3.

For purposes of explanation, a Cartesian xyz-coordinate system is depicted in FIG. 1. The x-direction runs perpendicularly to the plane of the drawing into the latter. The y-direction runs horizontally and the z-direction runs vertically. The scanning direction runs along the y-direction in FIG. 1. The z-direction runs perpendicularly to the object plane 6.

The projection exposure apparatus 1 comprises a projection system 10. The projection system 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, such as along the y-direction. The displacement on the one hand of the reticle 7 by way of the reticle displacement drive 9 and on the other hand of the wafer 13 by way of the wafer displacement drive 15 can take place in such a way as to be synchronized with one another.

The radiation source 3 is an EUV radiation source. The radiation source 3 emits, for example, EUV radiation 16, which is also referred to below as used radiation, illumination radiation or illumination light. For example, the used radiation has a wavelength in the range between 5 nm and 30 nm. The radiation source 3 may be a plasma source, for example an LPP source (Laser Produced Plasma) or a GDPP source (Gas Discharge Produced Plasma). It can also be a synchrotron-based radiation source. The radiation source 3 can be a free electron laser (FEL).

The illumination radiation 16 emanating from the radiation source 3 is focused by a collector mirror 17. The collector mirror 17 can be a collector mirror with one or more ellipsoidal and/or hyperboloidal reflection surfaces. The at least one reflection surface of the collector mirror 17 can be impinged on by the illumination radiation 16 with grazing incidence (GI), i.e. at angles of incidence of greater than 45°, or with normal incidence (NI), i.e. at angles of incidence of less than 45°. The collector mirror 17 can be structured and/or coated, firstly, for optimizing its reflectivity for the used radiation and, secondly, for suppressing extraneous light.

The illumination radiation 16 propagates through an intermediate focus in an intermediate focal plane 18 downstream of the collector mirror 17. The intermediate focal plane 18 can represent a separation between a radiation source module, having the radiation source 3 and the collector mirror 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. The first facet mirror 20 comprises a multiplicity of individual first facets 21, which are also referred to as field facets below. FIG. 1 depicts only some of the facets 21 by way of example. In the beam path of the illumination optical unit 4, a second facet mirror 22 is arranged downstream of the first facet mirror 20. The second facet mirror 22 comprises a plurality of second facets 23.

The illumination optical unit 4 consequently forms a doubly faceted system. This basic principle is also referred to as a fly's eye condenser (fly's eye integrator). The individual first facets 21 are imaged into the object field 5 with the aid of the second facet mirror 22. The second facet mirror 22 is the last beam-shaping mirror or else, in fact, the last mirror for the illumination radiation 16 in the beam path upstream of the object field 5.

The projection system 10 comprises a plurality of mirrors Mi, which are consecutively numbered in accordance with their arrangement in the beam path of the projection exposure apparatus 1.

In the example depicted in FIG. 1, the projection system 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection system 10 is a doubly obscured optical unit. The projection system 10 has an image-side numerical aperture that is greater than 0.4 or 0.5 and can also be greater than 0.6, and can be for example 0.7 or 0.75.

Just like the mirrors of the illumination optical unit 4, the mirrors Mi can have a highly reflective coating for the illumination radiation 16 (EUV radiation).

Figure 2A:
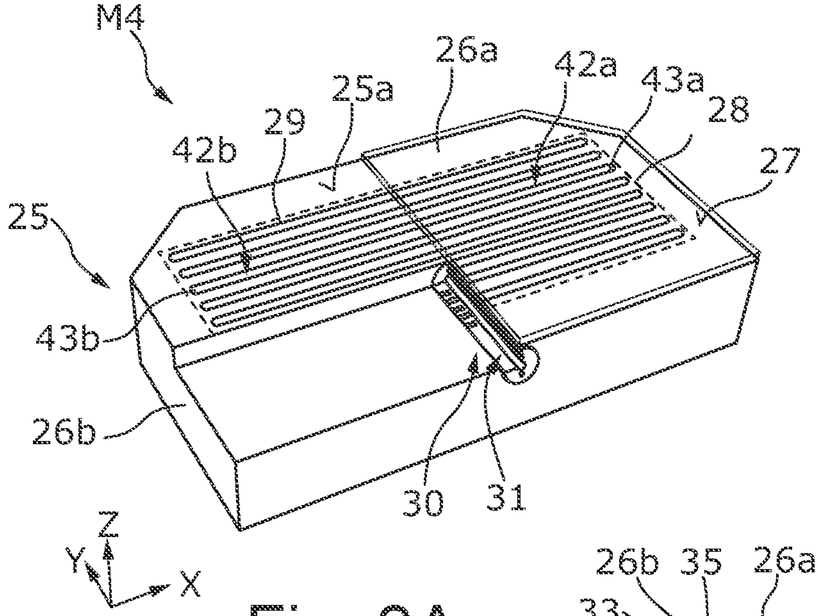
FIG. 2A-2D show schematic illustrations of a mirror of the projection exposure apparatus of FIG. 1, having a plurality of cooling channels and an insert component which is inserted into a cavity of the substrate.

FIGS. 2A-2D show the fourth mirror M4 of the projection system 10 in detail. The mirror M4 has a substrate 25 which is formed from a so-called zero expansion material. In the present example, the zero expansion material is titanium-doped quartz glass (ULE®), but the substrate 25 may also be formed from other zero crossing materials. The substrate 25 has a first partial body 26*a* and a second partial body 26*b* which are put together (bonded) at an interface 25*a* that is flat in the example shown. A coating 28 whose lateral edge is depicted using dashed lines in FIG. 2A is applied to a surface 27 of the first partial body 26*a*, the surface being flat in FIGS. 2A-2D. The reflective coating 28 is designed to reflect the EUV radiation 16. To this end, the reflective coating 28 is designed as an interference layer system and has a plurality of layers which alternate between having a high and low refractive index. In the example shown in FIG. 2A, the reflective coating 28 is only applied to a partial region of the surface 27 of the first partial body 26*a*, but it is understood that the reflective coating 28 may also cover the entire surface 27 of the first partial body 26*a*.

As is evident from FIG. 2A, a plurality of cooling channels 29 run in the substrate 25 below the surface 27 with the reflective coating 28. In the example shown in FIG. 2A, the cooling channels are formed by grooves which are introduced into the second partial body 26*b* adjacent to the interface 25*a*. The first partial body 26*a* has a slab-like form and covers the grooves or the cooling channels 29 in the second partial body 26*b* over the whole area. It is understood that a part of the cross section of the cooling channels 29 may also be formed in the first partial body 26*a*. Moreover, it is not mandatory for the substrate 25 to be put together from two or more partial bodies 26*a,b*; instead, the substrate 25 may optionally also have a one-part form. In any case, the comparatively small distance between the cooling channels 29 and the surface 27 to which the reflective coating 28 is applied facilitates effective cooling of the optical element M4 in the region where the EUV radiation 16 is incident on the reflective coating 28.

To have a cooling fluid in the form of cooling water (not depicted in FIGS. 2A-2D) flow through the cooling channels 29, a rod-like, substantially cylindrical insert component 31 has been introduced into a cylindrical cavity 30 of the substrate 25. In the example shown, the cavity 30 is formed in the style of a blind hole. In the example shown, the rod-like insert component 31 has a one-piece form and is matched in terms of its geometry and dimensions to the geometry and dimensions of the cavity 30. The insert component 31 can protrude to the outside beyond substrate 25 or beyond the cavity 30, as depicted in FIG. 2A; however, this is not mandatory.

Figure 2B:
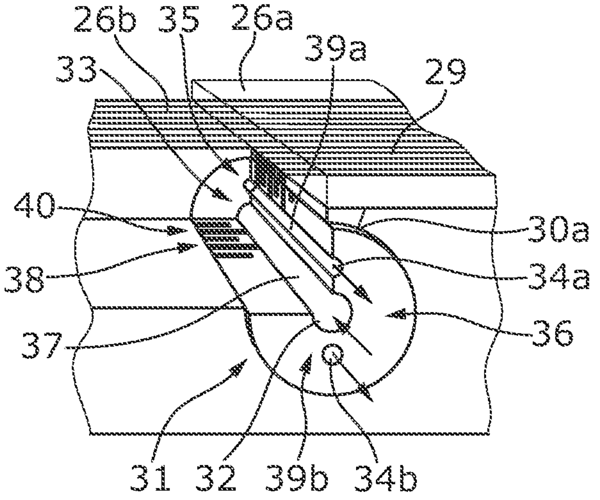

As is evident from FIG. 2B, the insert component 32 has a cooling fluid inlet 32 and a distributor 33 which serves to connect the cooling fluid inlet 32 to the plurality of cooling channels 29. The insert component 31 also has two cooling fluid outlets 34*a,b*, which are connected to the plurality of cooling channels 29 by way of a collector 35. The cooling fluid inlet 32 and the two cooling fluid outlets 34*a,b* form openings on a common end side 36 of the rod-like insert component 31.

For the connection between the cooling fluid inlet 32 and the plurality of cooling channels 29, the distributor 33 has a common inlet channel 37, which adjoins the cooling fluid inlet 32 at the end side 36 of the insert component 31. The inlet channel 37 extends in the centre of the rod-like insert component 31 along the longitudinal axis thereof, which runs parallel to a Y-direction of an XYZ-coordinate system shown in FIG. 2A. A plurality of feeders 38 formed in the insert component 31 open into the common inlet channel 37, each feeder serving to establish a connection between the distributor 33 and one of the cooling channels 29. The number of feeders 38 corresponds to the number of cooling channels 29 in the example shown.

The collector 35 has two outlet channels 39*a,b*, which adjoin a respective cooling fluid outlet 34*a,b*, for establishing the connection between the two cooling fluid outlets 34*a,b* and the plurality of cooling channels 29. The two outlet channels 39*a,b* extend in the longitudinal direction of the rod-like insert component 31 and are offset radially to the outside from the centre of the insert component 31. A plurality of offtakes 40 formed in the insert component 31 open into the common outlet channels 39*a,b*, each offtake serving to establish a connection between the collector 35 and one of the cooling channels 29. The number of offtakes 40 corresponds to the number of cooling channels 29 in the example shown.

Figure 2C:
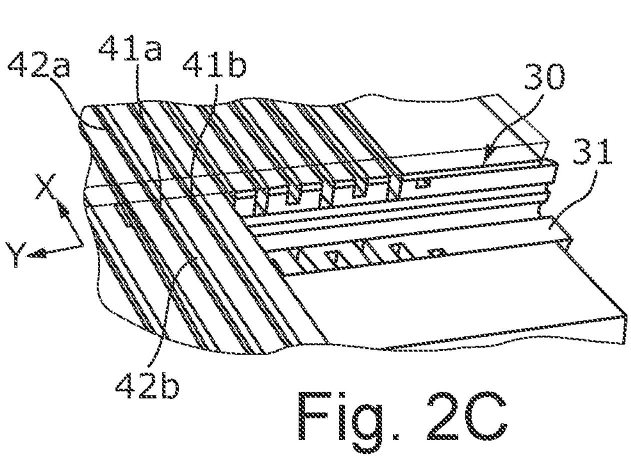

As is evident from FIG. 2C, the cavity 30 formed in the substrate 25 cuts into the cooling channels 29: In this way, a first opening 41*a* that is connected to a respective feeder 38 of the distributor 33 is formed in a respective cooling channel 29. Accordingly, a respective cooling channel 29 is connected to an offtake 40 of the collector 35 of the insert component 31 by way of a second opening 41*b* in the substrate 25.

As is evident from FIG. 2A and FIG. 2C, a respective cooling channel 29 in the substrate 25 extends substantially perpendicularly to the longitudinal direction of the insert component 31. A respective cooling channel 29 has a self-contained elongate contour with two channel portions 42*a,b*, which extend on opposite sides of the insert component 31: Starting from the first opening 41*a*, a first channel portion 42*a* initially extends in a straight line in the positive X-direction until it reaches a first semi-circular deflection portion 43*a* for reversing a direction of flow of the cooling fluid. From the first deflection portion 43*a*, the first channel portion 42*a* continues to run in a straight line to the second opening 41*b*. Starting from the first opening 41*a*, a second channel portion 42*a* accordingly initially extends in a straight line in the negative X-direction until it reaches a second semi-circular deflection portion 43*b* for reversing the direction of flow of the cooling fluid. From the second deflection portion 43*b*, the first channel portion 42*b* continues to run in a straight line back to the second opening 41*b*.

In the example shown in FIG. 2A, the flow of cooling fluid emerging from the feeder 38 is divided among the two channel portions 42*a,b* when passing through the first opening 41*a*. The cooling fluid flowing through the two channel portions 42*a,b* is then brought together at the second opening 41*b* and leaves the cooling channel 29 through the second opening 41*b* and the associated offtake 40.

Figure 2D:
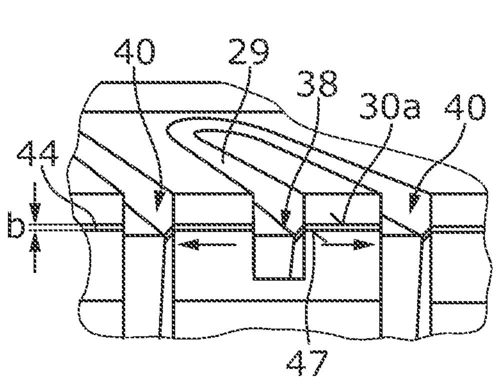

The distributor 33 and collector 35 are separated from one another in the insert component 31, that is to say there is no fluid connection in the insert component 31 between the distributor 33 and the collector 35. However, there is an (actually unwanted) fluid connection between a respective feeder 38 and a respective offtake 40 by way of a gap 44 which is shown in FIG. 2D and formed between a cylindrical lateral surface 47 of the insert component 31 and a cylindrical wall 30*a* of the cavity 30 (cf. the arrows in FIG. 2D). The gap 44 depicted in FIG. 2D has a gap width b of slightly less than approximately 0.5 mm or 0.1 mm. The dimensions of the insert component 31 and cavity are matched as precisely as possible to one another such that the width b of the gap 44 is as small as possible. To avoid the width b of the gap 44 changing significantly when the mirror M4 heats up, the insert component 31 is formed from a material with a low coefficient of thermal expansion, to be precise Invar in the example shown.

Figure 3A:
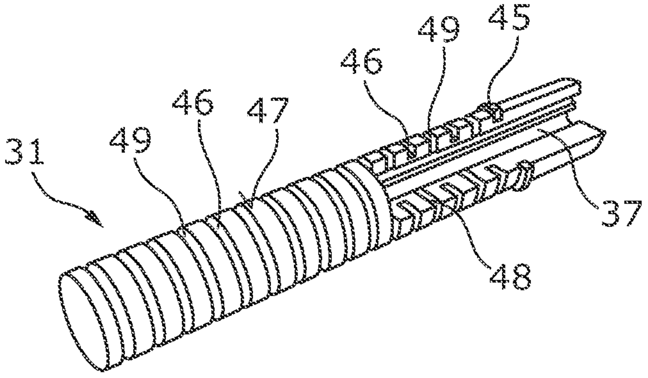
FIG. 3A-3B show schematic illustrations of the insert component of FIGS. 2A-2D and a double pipeline for connecting a cooling circuit to the insert component, in each case in a partial section.

A seal 45 in the form of an O-ring serves to seal the gap 44 with respect to the surroundings of the optical element M4, the seal being introduced into a circumferential annular groove formed on the lateral surface of the insert component 31, as is evident from FIG. 3A which shows the insert component 31 in a partial sectional illustration. Although in principle the provision of further seals for separating the feeders 38 from the offtakes 40 in fluid-tight fashion is possible, such a seal is not required, in general, since the pressure loss over the gap 44 is comparatively low.

There are various options for the design of the feeders 38, which start from the common inlet channel 37, and for the design of the offtakes 40, which start from two outlet channels 39*a,b* in the example shown. In the case of the insert component 31 shown in FIGS. 2A-2D and in FIG. 3A, a respective feeder 38 has a feed groove 46, which is introduced into the lateral surface 47 of the insert component 31 and which completely runs around the lateral surface 47 in the circumferential direction. As is easily evident from FIG. 3A, a respective feeder 38 moreover has a plurality of feed channels 48 that extend in the radial direction and adjoin the feed groove 46 in the radial direction, the feed channels connecting the feed groove 46 and the inlet channel 37. A respective feed channel 48 in the form of a radial bore opens into the feed groove 46.

In the insert component 31 shown in FIG. 3A, a respective offtake 38 is formed as an offtake groove 49, which is likewise formed on the lateral surface 47 of the insert component 31 and which completely runs around the latter in the circumferential direction. Since the two outlet channels 34*a,b* are radially further outside than the inlet channel 37, the offtake groove 49 has such a deep form in the example shown that the latter cuts into the outlet channels 34*a,b*, and so it is possible to dispense with the provision of radial bores for connecting a respective offtake groove 49 to the outlet channels 34*a,b*. Unlike what is shown in FIGS. 2A-2D and in FIG. 3A, it may optionally also be possible to completely dispense with the provision of feed grooves 46 and/or offtake grooves 49.

Figure 3B:
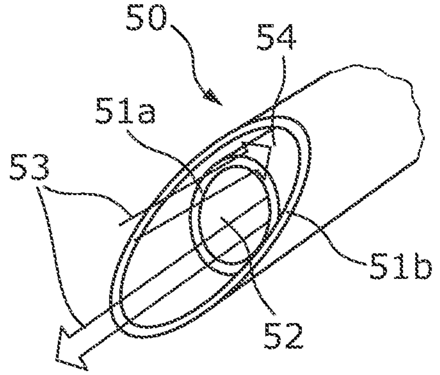

The insert component 31 shown in FIGS. 2A-2D and in FIG. 3A, on the end side 36 of which the cooling fluid inlet 31 is mounted radially to the inside and the two cooling fluid outlets 34*a-b* are mounted radially to the outside, allows the insert component 31 to be connected to a double pipeline 50, which is shown in exemplary fashion in FIG. 3B. The double pipeline 50 has an inner pipe 51*a* and an outer pipe 51*b*. In the example shown in FIG. 3B, the cooling fluid 53 is supplied to the coolant inlet 32 of the insert component 31 in an interior 52 of the inner pipe 51*a*. Accordingly, the cooling fluid 53 is led away from the insert component 31, starting from the two cooling fluid outlets 34*a,b*, in an interstice 54 between the inner pipe 51*a* and the outer pipe 51*b*. The double pipeline can be connected in fluid-tight fashion to the insert component 31 in the region of its end face 36.

The insert component 31 shown in FIGS. 2A-2D and in FIG. 3A is a conventionally manufactured component, in which the distributor 33 and the collector 35 are introduced in a rod-like cylindrical blank made of Invar by way of mechanical processing, in general by drilling and/or milling. In general, the integration of functional components is not easily possible in such a conventionally manufactured insert component 31.

Figure 4A:
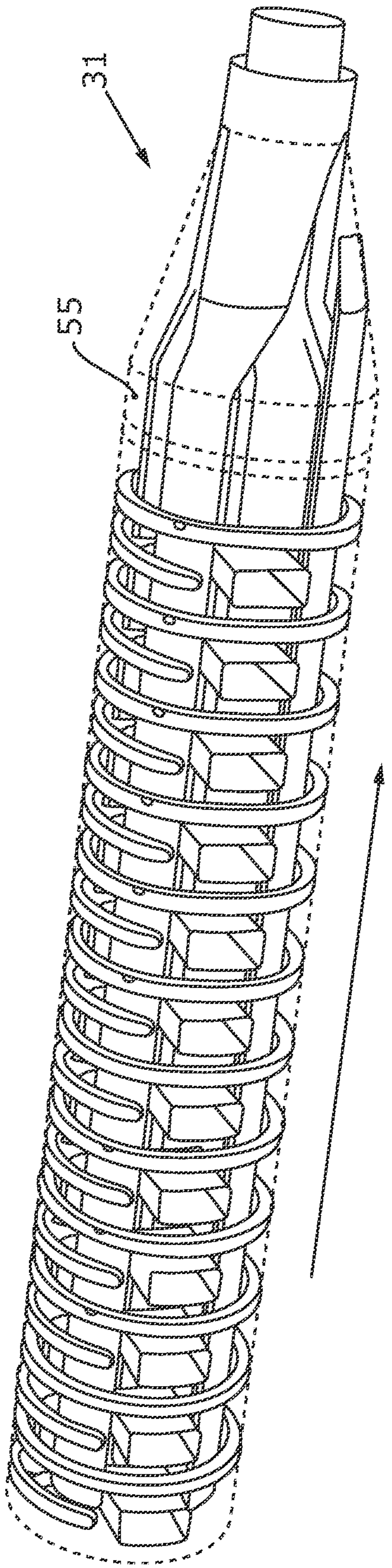
FIG. 4A-4C show schematic illustrations of an insert component which has valves for controlling a flow rate of the cooling fluid through the cooling channels.
Figure 4C:
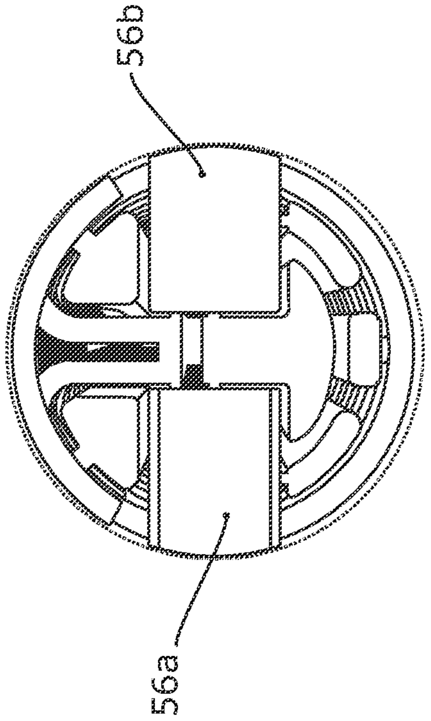
Figure 4B:
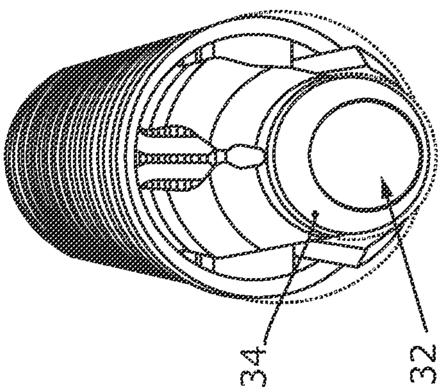

FIGS. 4A-4C show an insert component 31 with a substantially cylindrical main body that was produced in an additive manufacturing method. In the additive manufacturing method, the main body 55 was produced layer-by-layer from a powder bed, to be precise along a construction direction, which is indicated by an arrow in FIG. 4A and which corresponds to the longitudinal direction of the main body 55. On an end side, the main body 55 has a conically tapering portion, on which the central cooling fluid inlet 32 and a single ring-shaped cooling fluid outlet 34 are formed. Like the insert component 31 shown in FIGS. 2A-2D, the insert component 31 shown in FIGS. 4A-4C is inserted into the cylindrical cavity 30 of the substrate 25 shown in FIG. 2A. In this case, the conical portion of the main body 25 in FIG. 4A protrudes beyond the substrate 25 to the outside and serves to contact the insert component 31 with the double pipeline 50 shown in FIG. 3B.

The main body 55 of the rod-like insert component 31 is formed in the style of a hollow structure and has a plurality of cavities in its interior, the cavities rendering it possible to integrate different functional components into the insert component 31. However, in principle the structure of the insert component 31 of FIG. 4A-4C does not differ from the insert component 31 shown in FIGS. 2A-2D and in FIG. 3A, as is evident from FIGS. 5A-5B and FIGS. 6A-6B, in which the distributor 38 and the collector 40, which are described in more detail below, are highlighted in each case.

Figure 5B:
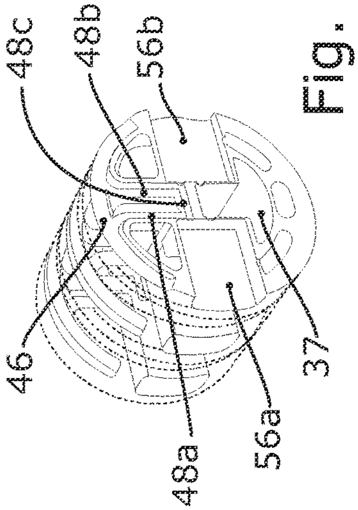
FIG. 5A-5B show schematic illustrations of a distributor of the insert component of FIGS. 4A-4C with respectively two valves for controlling the flow rate of the cooling fluid through a cooling channel.
Figure 6B:
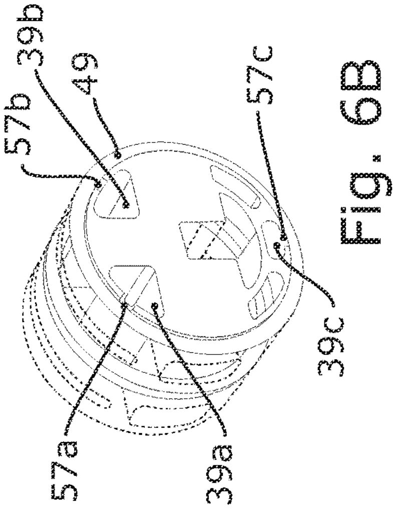
FIG. 6A-6B show schematic illustrations of the collector of the insert component of FIGS. 4A-4C, FIG. 7A-7B show schematic illustrations of a cable channel of the insert component of FIGS. 4A-4C, FIG. 8A-8B show schematic illustrations of the flow through two different arrangements of cooling channels of the insert component of FIGS. 4A-4C, in which the cooling fluid flows through groups of cooling channels with different flow rates.
Figure 5A:
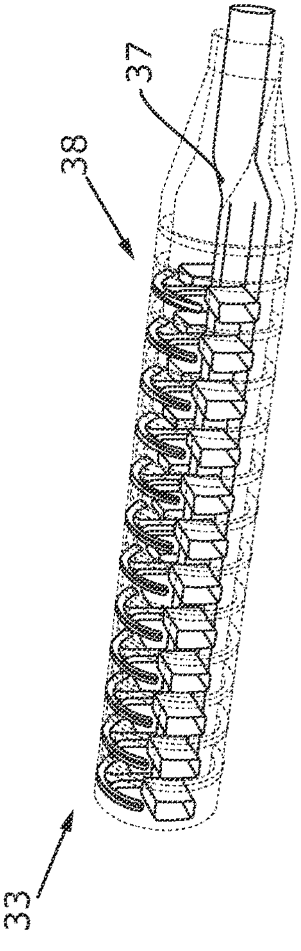

As is evident from FIGS. 5A-5B, two switchable valves 56*a*, 56*b* are arranged in the distributor 33 between the inlet channel 37, which extends in the longitudinal direction of the insert component 31, and a respective feeder 38. The two valves 56*a*, 56*b* are connected in parallel, that is to say the cooling fluid 53, starting from the inlet channel 37, can flow through both valves 56*a*, 56*b* in parallel and arrive at one and the same feeder 38 provided the valves 56*a*, 56*b* are in a switching state which facilitates the supply of the cooling fluid 53 to the feeder 38. As is evident from FIG. 5B, a respective feeder 38 has a feed groove 46, which does not completely run around the lateral surface 47 of the insert component 31 in the circumferential direction in order to make space for the valves 56*a,b*, which are inserted into the main body 55 via the lateral surface 47 from the outside, level with the feed groove 46. The feed groove 46 is connected to both valves 56*a,b* via two supply channels 48*a,b* running in parallel. Moreover, the two supply channels 48*a,b* are interconnected via a connecting portion 48*c*, which interconnects the outputs of the two valves 56*a*, 56*b*.

Should the cooling fluid 53 be supplied to two separate cooling channels 29 via one and the same feed groove 46, the two cooling channel portions 42*a*, 42*b* shown in FIG. 2A can be separated from one another by a web or the like formed in the substrate 25. If the connecting portion 48*c* is dispensed with in this case, the flow through the two separate cooling channels which are connected to the feed groove 46 can be set independently of one another with the aid of the first valve 56*a* or with the aid of the second valve 56*b*.

Figure 6A:
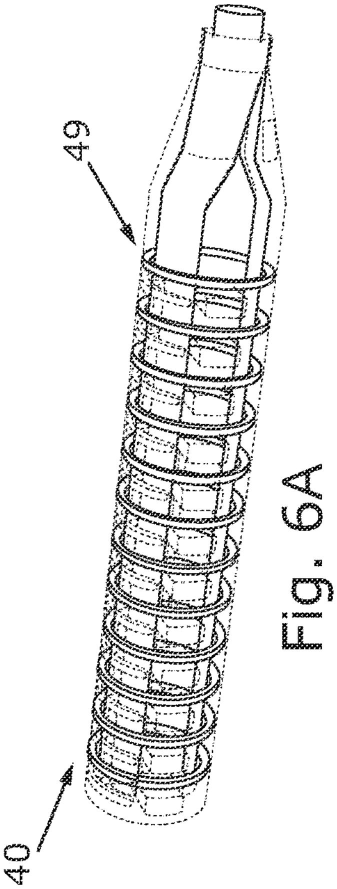

FIG. 6*a,b* shows the collector 40 which has offtake grooves 49 that run around in ring-shaped fashion, like in the insert component 31 shown in FIGS. 2A-2D. In the example shown, the collector 40 has three outlet channels 39*a-c*, which extend in the longitudinal direction of the insert component 31 and which are connected to the common, ring-shaped cooling fluid outlet 34. A respective outlet channel 39*a-c* is connected to an associated offtake groove 49 via a respective offtake channel 57*a-c* that runs in the radial direction.

Figure 7B:
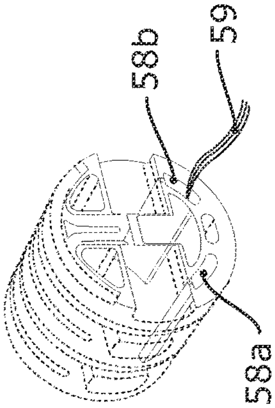
Figure 7A:
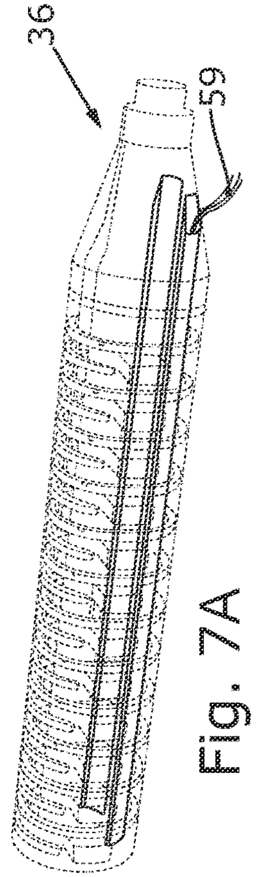

As is evident in FIGS. 7A-7B, two cable channels 58*a,b* are integrated into the main body 55 for the electrical contacting of the valves 56*a,b*, the cable channels extending along the longitudinal direction of the insert component 31. Electrical lines 59 which is serve for electrical contacting of the respective first and second valves 56*a,b* run in the cable channels 58*a,b*. As is evident from FIG. 7A, the electrical lines 59 are guided out of the cable channels 58*a,b* in the region of the end side 36 or the conical part of the main body 55 and are connected to a control device (not shown) for actuating the valves 56*a,b*. To seal the cable channels 58*a,b* in fluid-tight fashion, the valves 56*a,b* may optionally be moulded into the main body 55. However, the valves 56*a,b* may also be sealed with respect to the cable channels 58*a,b* in any other way. It is self-evident that the cable channels 58*a,b* may also serve for the electrical contacting of other functional components integrated into the main body 55, as described in more detail further below.

With the aid of the switchable valves 56*a,b*, which are connected in each case to a feed groove 46 for one of the cooling channels 29 shown in FIG. 2A, it is possible, as will be described below on the basis of FIGS. 8A-8B, to set or influence a temperature distribution zone-by-zone below the surface 27 to which the reflective coating 28 is applied.

Figure 8A:
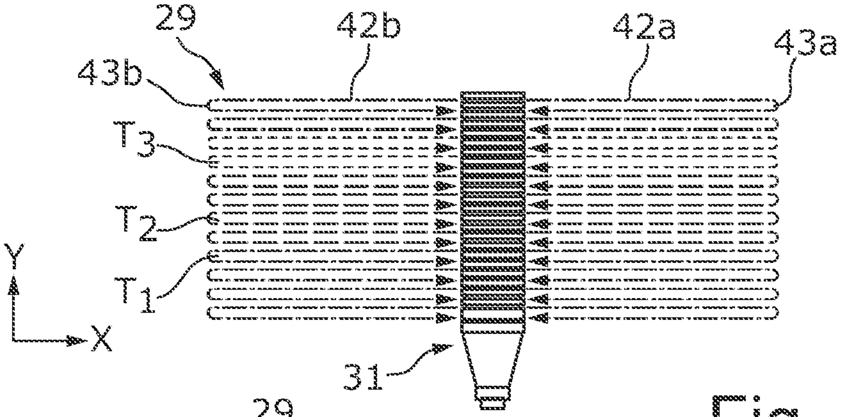

In FIG. 8A, the cooling channels 29 of FIG. 2A are depicted on the basis of the flow direction of the cooling fluid 53. As described further above, the cooling fluid 58 supplied to a cooling channel 29 via a feed groove 46 is split among two channel portions 42*a,b* and is guided back to the associated offtake groove 49 via the deflection regions 43*a,b*. With the aid of the two switchable valves 56*a,b*, which are each switchable between a first, completely closed switching state and a second, completely open switching state, it is possible to set three different flow rates through a respective cooling channel 29, which flow rates are distinguished in FIG. 8A by a different type of dashes.

In a first group of cooling channels 29, depicted with a dash-dotted line in FIG. 8A, the two valves 56*a,b* are in the first switching state, that is to say no cooling fluid 53 flows through the first group of cooling channels 29. Accordingly, there is no cooling by the cooling channels 29 of the first group and the substrate 25 has a first temperature $T_1$ in the surroundings of the cooling channels 29 of the first group. In a second group of cooling channels 29, depicted in FIG. 8A by dashed lines with long dashes, the first valve 56*a* is in the first switching state and the second valve 56*b* is in the second switching state, or vice versa, and so the cooling fluid 53 flows through a respective cooling channel 29 at half the maximum flow rate and the substrate 25 in the surroundings of a respective cooling channel 29 has a second temperature $T_2$. In a third group of cooling channels 29, depicted in FIG. 8A by dashed lines with short dashes, both valves 56*a,b* are in the second switching state, that is to say the cooling fluid 53 flows through the second group of cooling channels 29 at the maximum flow rate. Accordingly, the substrate 25 has a third temperature $T_3$ in the surroundings of the cooling channels 29 of the third group, the following applying: $T_1>T_2>T_3$.

By way of suitably actuating the two valves 56*a,b*, a respective cooling channel 29 can be assigned to one of the three groups and hence there can be zonal control of the temperature of the substrate 25. In this way, it is possible to set—within limits—a spatially dependent temperature distribution of the substrate 25 below the surface 27 to which the reflective coating 28 is applied. The resolution and the geometry of the temperature distribution generated hereby is defined by the size and the geometry of the area covered by a respective cooling channel 29 below the surface 27. In the example shown in FIG. 8A, the temperature distribution in the substrate 25 can be set in a plurality of elongate temperature zones that extend in the X-direction, only have a small extent in the Y-direction and substantially correspond to the extent of a respective cooling channel 29.

Figure 8B:
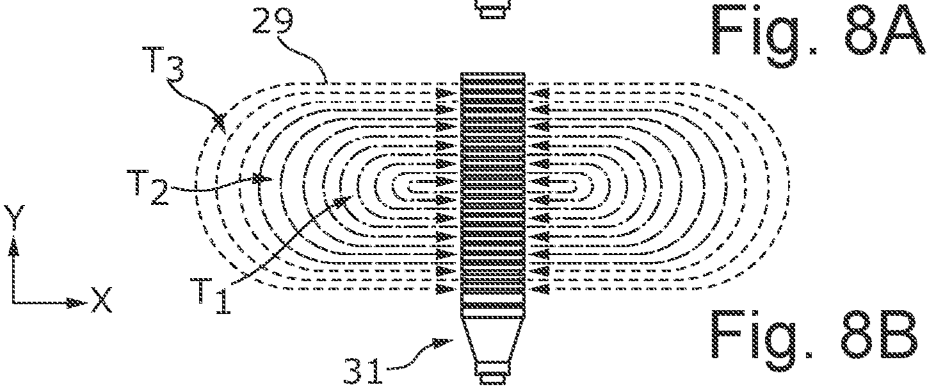

In the example shown in FIG. 8B, the cooling channels 29 are arranged differently than in FIG. 8A or in FIG. 2A, to be precise they are arranged concentrically around the centre of the surface 27 of the substrate 25 to which the reflective coating 28 is applied. This centre approximately corresponds to the middle (in the longitudinal direction) of the insert component 31 shown in FIG. 8*b*, from where the innermost and shortest of the concentric cooling channels 29 starts. In the example shown in FIG. 8*b*, the cooling channels 29 are likewise divided in three groups according to their flow rate, the groups being arranged concentrically around the middle of the insert component 31.

It is understood that in place of the illustrations shown in FIGS. 8A-8B it is possible to define a different arrangement of the cooling channels 29 and hence a different arrangement and geometry of the temperature zones in which it is possible to set a respective temperature $T_1$, $T_2$, $T_3$ of the substrate 25.

Unlike what is shown in FIGS. 8A-8B, the temperature in the substrate 25 on the left side of the insert component 31 and on the right side of the insert component 31 can be set independently of one another if the two channel portions 42*a*, 42*b* do not form a common cooling channel 29 but two mutually separate cooling channels, as described further above in the context of FIG. 5B.

Figure 9A:
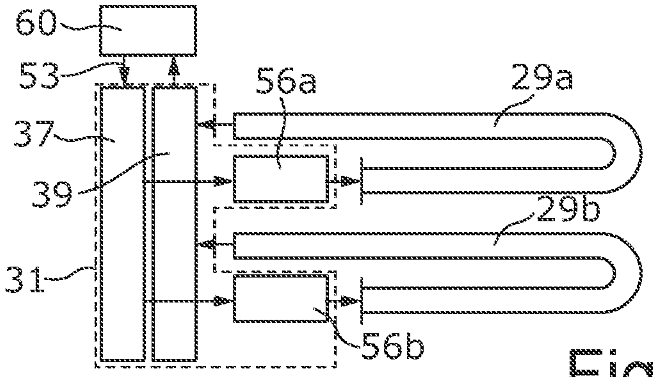
FIG. 9A-9B show schematic illustrations of the flow through two cooling channels using a respective valve or a valve, a heating element and a temperature sensor.

FIG. 9A very schematically shows the supply of two adjacent cooling channels 29*a,b*, which are each supplied with the cooling fluid 53 by way of a dedicated valve 56*a*, 56*b*. The cooling fluid 53 is supplied to the valves 56*a,b* by the common inlet channel 37, flows through a feeder and the respective cooling channel 29*a,b*, and leaves the respective cooling channel 29*a,b* via an offtake that is connected to the outlet channel 39.

The cooling fluid 53 is supplied to the insert component 31, indicated using dashed lines in FIG. 9A, by way of a cooling device 60 which is part of the EUV lithography apparatus 1 and which has a pump and further components not depicted here. In the example shown in FIG. 9A, the valves 56*a,b* are switchable between more than two switching states for the purposes of setting the flow rate of the cooling fluid 53 through the respective cooling channel 29*a,b*. The valves 56*a,b* shown in FIG. 9A and in FIGS. 5A-5B may be in the form of miniaturized valves, for example, which facilitate switching between the switching states with the aid of a shape memory alloy.

Figure 9B:
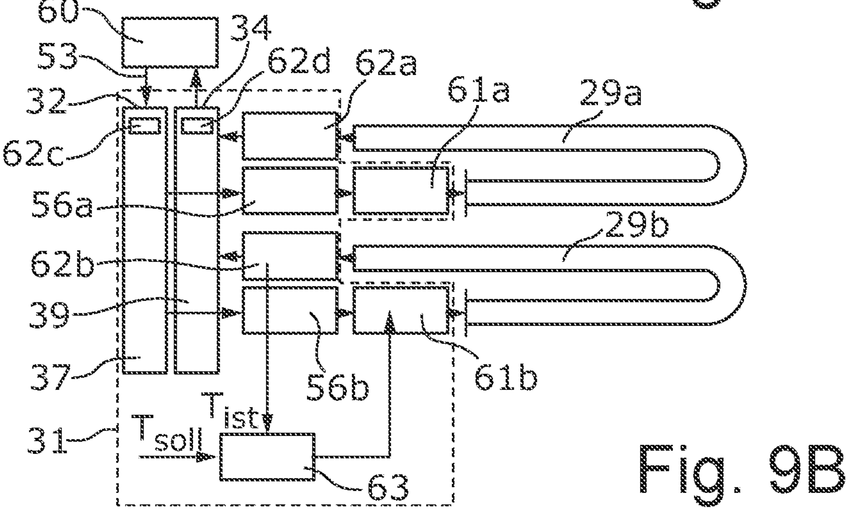

In the example shown in FIG. 9B, the insert component 31 has in addition to the two valves 56*a,b* two temperature control elements in the form of heating elements 61*a,b* which serve to heat the cooling fluid 53 prior to the supply to the respective cooling channel 29*a,b*. The heating elements 61*a,b* are arranged between the inlet channel 37 and a feeder, not depicted here, of the insert component 31 to the respective cooling channel 29*a,b*, downstream of a respective switchable valve 56*a,b* in the path of the flow. By heating the cooling fluid 53 with the aid of a respective heating element 61*a,b*, it is possible to set the temperature in the associated cooling channel 29*a,b*. If the heating elements 61*a,b* are used, it is possible to choose the temperature in the inlet channel 37 to be lower than what is otherwise conventional, for example it may be at approximately 18° C. By way of the respective heating element 61*a,b* it is possible to increase the temperature in the associated cooling channel 29*a,b*, for example to room temperature (22° C.), provided no cooling is required in a zone of the substrate 25 associated with the cooling channel 29*a,b*. It is understood that the provision of the valves 56*a,b* in the insert component 31 may optionally be completely dispensed with in the example shown in FIG. 9B. By way of example, the heating elements 61*a,b* may be in the form of miniaturized heaters based on silicon nitride. Other types of temperature control elements 61*a,b*, for example in the form of Peltier elements or the like, are possible, which facilitate cooling of the cooling fluid 53 or combined heating and cooling of the cooling fluid 53.

The insert component 31 shown in FIG. 9B also has temperature sensors 62*a,b*, which are associated with a respective cooling channel 29*a,b*. The temperature sensors 62*a,b* are arranged in the region of a respective offtake, not depicted here, of the insert component 31 and serve to measure the temperature of the cooling fluid 53 when leaving the respective cooling channel 29*a,b*. Such an arrangement is desirable since the temperature of the cooling fluid 53 at the feeder to the cooling channels 29*a,b* substantially corresponds to the temperature of the cooling fluid 53 in the inlet channel 37. It is understood that, additionally or as an alternative, the temperature of the cooling fluid 53 may also be measured at the entrance to the respective cooling channel 29*a,b* using a respective temperature sensor, which is arranged in or downstream of the respective heating element 61*a,b*. In this way it is possible to measure the temperature of the cooling fluid 53 both at the entrance and at the exit of a respective cooling channel 29*a,b*.

The temperature of the cooling fluid 53 in the inlet channel 37 and in the outlet channel 39 is also measured by way of a respective dedicated temperature sensor 62*c*, 62*d* in the example shown in FIG. 9B. As is evident from FIG. 9B, the temperature sensor 62*c* in the inlet channel 37 is arranged directly adjacent to the cooling fluid inlet 32 in order to register and optionally correct the crosstalk or the influence of heat sources in the feeder or in the cooling device 60 (see below). Accordingly, the temperature sensor 63*d* is arranged immediately adjacent to the cooling fluid outlet 34 in the outlet channel 39, in order to determine and optionally correct the exposure load or the temperature increase during the exposure (see below).

In a control loop, the information supplied by the temperature sensors 62A-2D can serve to set a desired temperature distribution, for example a substantially homogeneous temperature distribution, in the substrate 25. A controller 63 is shown in FIG. 9B in exemplary fashion, the second temperature sensor 62*b* arranged in the second cooling channel 29*b* supplying the monitored or measured actual temperature $T_{IST}$ of the cooling fluid 53 at the output of the second cooling channel 29*b* to the controller. The controller 63 regulates the actual temperature $T_{IST}$ in the second cooling channel 29*b* to a target temperature $T_{SOLL}$ that is usually specified by an external mechanism, for example by the cooling device 60, for the controller 63. In the example shown, the controller 63 suitably acts on the second heating element 61*b* in order to minimize the difference between the actual temperature $T_{IST}$ and the target temperature $T_{SOLL}$.

It is understood that, for this purpose, the controller 63 can act not only on the second heating element 61*b* but on all heating elements 61*a,b* and/or on the switchable valves 56*a,b* of FIG. 9A. Additionally, for closed-loop temperature control, the controller 63 can use not only the actual temperature $T_{IST}$ measured by the second temperature sensor 62*b* but also the actual temperatures measured by the other temperature sensors 62*a*, 62*c*, 62*d*. Typically, the local resolution during closed-loop control of the temperature distribution improves as more temperature sensors are provided.

However, it is also possible for the insert component 31 to have no functional components that facilitate an adjustment of the temperature distribution. In this case, the temperature sensors 62*a,b* only serve to monitor the temperature in the cooling channels 29*a,b* or in the substrate 25, for example to determine malfunctions in the supply of the mirror M4 with the cooling fluid 53 or to optionally adjust parameters of the EUV lithography apparatus 1, for example the power of the radiation source 3, when desired.

The electrical contacting of the heating elements 61*a,b* and the temperature sensors 62A-2D can be implemented in the manner described further above in the context of FIGS. 7A-7B, that is to say by way of the two cable channels 58*a,b* integrated in the main body of the insert component 31 or by way of corresponding electrical lines 59.

The insert component 31 depicted in FIGS. 4A-4C with the main body 35 produced in an additive manufacturing method facilitates maximal functional integration in minimal volume: Despite the integrated functional components in the form of the valves 56*a,b*, the heating elements 61*a,b* and/or the temperature sensors 62A-2D, the insert component 31 shown in FIGS. 4A-4D can have a small external diameter of no more than approximately 35 mm. On account of the optionally comparatively small thickness of the substrate 25, such dimensioning of the insert component 31 is desirable because integration into the cavity 30 of the substrate 25 would otherwise not be possible.

What is claimed is:

1. An optical element, comprising:

a substrate;

a reflective coating supported by a surface of the substrate;

a plurality of cooling channels running in the substrate below the surface of the substrate;

a distributor configured to connect a cooling fluid inlet to the plurality of cooling channels;

a collector configured to connect the plurality of cooling channels to a cooling fluid outlet; and an insert component in a cavity of the substrate, wherein the distributor and/or the collector are integrated into the insert component.

2. The optical element of claim 1, wherein the insert component is rod-like.

3. The optical element of claim 1, wherein both the distributor and the collector are integrated into the insert component.

4. The optical element of claim 3, wherein the cooling fluid inlet and the cooling fluid outlet are supported on the same side of the insert component to connect to a pipeline.

5. The optical element of claim 3, wherein the cooling fluid inlet is mounted radially on an inside to the insert component to connect to an interior of an inner pipe of a double pipeline, and the cooling fluid outlet is mounted radially on an outside to the insert component to connect to an interstice between the inner pipe and an outer pipe of the pipeline, or vice versa.

6. The optical element of claim 1, further comprising a seal configured to seal a gap between a wall of the cavity and the insert component.

7. The optical element of claim 1, wherein a cooling channel has a deflection portion configured to deflect the cooling fluid.

8. The optical element of claim 1, wherein the distributor comprises a plurality of feeders configured to connect the cooling fluid inlet to at least one cooling channel in each case, and/or wherein the collector comprises a plurality of offtakes configured to connect the cooling fluid outlet to at least one cooling channel in each case.

9. The optical element of claim 8, wherein the feeders open into at least one common inlet channel connected to the cooling fluid inlet, and/or wherein the offtakes open into at least one common outlet channel connected to the cooling fluid outlet.

10. The optical element of claim 9, wherein the feeders are connected to the common inlet channel via feed channels, and/or wherein the offtakes are connected to the common outlet channel via offtake channels.

11. The optical element of claim 8, wherein the feeders form or have an at least partly circumferential feed groove on a lateral surface, and/or wherein the offtakes form or have an at least partly circumferential offtake groove on a lateral surface of the insert component.

12. The optical element of claim 1, wherein the distributor comprises a switchable valve configured to supply a cooling fluid to a cooling channel.

13. The optical element of claim 1, wherein the distributor comprises two switchable valves connected in parallel to supply the cooling fluid from the cooling fluid inlet to a feeder.

14. The optical element of claim 1, wherein the insert component comprises a temperature control element configured to control a temperature of the cooling fluid before the cooling fluid is supplied to a cooling channel.

15. The optical element of claim 1, wherein the insert component comprises a temperature sensor configured to monitor a temperature of the cooling fluid in at least one member selected from the group consisting of a cooling channel, an inlet channel and an outlet channel.

16. The optical element of claim 15, wherein the insert component comprises a closed-loop control device configured to regulate the temperature of the cooling fluid to a target temperature by acting on at least one member selected from the group consisting of a switchable valve and a temperature control element.

17. The optical element of claim 1, wherein the insert component comprises a cable channel configured to guide electrical lines to electrically contact at least one member selected from the group consisting of a valve, a temperature control element, and a temperature sensor.

18. The optical element of claim 1, wherein the substrate comprises first and second partial bodies put together at an interface, and the reflective coating is applied to a surface of the first partial body and the plurality of cooling channels running in the substrate in a region of the interface between the two partial bodies.

19. An optical arrangement, comprising:

an optical element according to claim 1; and a cooling device configured to flow a cooling fluid through the plurality of cooling channels.

20. An insert component configured to be introduced into a cavity of a substrate, the insert component comprising:

a main body comprising a cooling fluid inlet and a cooling fluid outlet;

a distributor integrated into the main body to connect the cooling fluid inlet to a plurality of feeders; and a collector integrated into the main body to connect the cooling fluid outlet to a plurality of offtakes.

21. The optical arrangement of claim 1, wherein the insert component and the distributor are a single component, and/or wherein the insert component and the collector are a single component.

22. The optical arrangement of claim 1, wherein the insert component is insertable into the cavity of the substrate.

* * * * *